(12) United States Patent
Liu et al.

(10) Patent No.: US 12,525,413 B2
(45) Date of Patent: Jan. 13, 2026

(54) LUMINOUS KEYBOARD AND BACKLIGHT MODULE THEREOF

(71) Applicant: Darfon Electronics Corp., Taoyuan (TW)

(72) Inventors: Hsin-Hung Liu, Taoyuan (TW); Chao-Yu Chen, Taoyuan (TW); Heng-Yi Huang, Taoyuan (TW); Hsin-Cheng Ho, Taoyuan (TW)

(73) Assignee: DARFON ELECTRONICS CORP., Taoyuan (TW)

( * ) Notice: Subject to any disclaimer, the term of this patent is extended or adjusted under 35 U.S.C. 154(b) by 399 days.

(21) Appl. No.: 18/179,420

(22) Filed: Mar. 7, 2023

(65) Prior Publication Data

US 2023/0207236 A1 Jun. 29, 2023

Related U.S. Application Data

(63) Continuation of application No. 17/699,594, filed on Mar. 21, 2022, now Pat. No. 11,830,688, and a
(Continued)

(30) Foreign Application Priority Data

Mar. 30, 2021 (TW) .................................. 110111653

(51) Int. Cl.
*H01H 13/83* (2006.01)
*F21V 8/00* (2006.01)
*G06F 3/02* (2006.01)

(52) U.S. Cl.
CPC ........... *H01H 13/83* (2013.01); *G02B 6/0035* (2013.01); *G06F 3/021* (2013.01); *H01H 2219/062* (2013.01)

(58) Field of Classification Search
CPC ............. H01H 13/83; H01H 2219/062; H01H 2219/06; H01H 2219/064; G02B 6/0035;
(Continued)

(56) References Cited

U.S. PATENT DOCUMENTS 8,770,772 B1    7/2014 Zhang
11,175,444 B1   11/2021 Pan
(Continued)

FOREIGN PATENT DOCUMENTS

TW    M497846 U    3/2015
TW    201913704 A  4/2019
TW    I697021 B    6/2020

OTHER PUBLICATIONS

TW Office Action dated Oct. 13, 2023 in Taiwan application No. 111146810.
(Continued)

*Primary Examiner* — Lheiren Mae A Caroc
(74) *Attorney, Agent, or Firm* — McClure, Qualey & Rodack, LLP

(57) ABSTRACT

A backlight module applicable to a key module is provided, the key module includes a plurality of key units and a baseplate, and the plurality of key units are disposed on the baseplate. The backlight module includes a lower substrate, a plurality of periphery light sources disposed along the peripheral of the baseplate, and a shielding structure. The lower substrate is disposed below the baseplate, and there is an outer edge gap between an outer edge of the baseplate and the lower substrate. The periphery light sources are disposed between the baseplate and the lower substrate. The shielding structure is disposed outside those periphery light sources distributed, to prevent light provided by the plurality of light sources from being emitted out of the outer edge gap.

16 Claims, 14 Drawing Sheets

Related U.S. Application Data continuation-in-part of application No. 17/234,808, filed on Apr. 20, 2021, now Pat. No. 11,764,004.

(58) Field of Classification Search
CPC ..... G02B 6/0011; G06F 3/021; G06F 3/0202; G06F 3/02; F21V 8/00
See application file for complete search history.

(56) References Cited

U.S. PATENT DOCUMENTS

| | | | |
|---|---|---|---|
| 11,830,688 B2 * | 11/2023 | Liu | H01H 13/83 |
| 11,914,185 B1 * | 2/2024 | Chen | H01H 13/14 |
| 2014/0369067 A1 | 12/2014 | Chen | |
| 2019/0080862 A1 | 3/2019 | Chiang et al. | |
| 2021/0082642 A1 | 3/2021 | Ho | |
| 2024/0096567 A1 * | 3/2024 | Chen | H01H 13/83 |

OTHER PUBLICATIONS

TW Office Action dated Jul. 20, 2022 in Taiwan application No. 110111653.
Non-Final Office Action issued in U.S. Appl. No. 17/699,594, filed Mar. 21, 2022, mailed Mar. 27, 2023.

* cited by examiner

LUMINOUS KEYBOARD AND BACKLIGHT MODULE THEREOF

CROSS REFERENCE TO RELATED APPLICATIONS

This application is a continuation of U.S. application Ser. No. 17/699,594 filed on Mar. 21, 2022, now U.S. Pat. No. 11,830,688, which claims the benefit of Taiwan patent application No. 110111653, filed on Mar. 30, 2021, and also claims the benefit of U.S. Non-provisional application Ser. No. 17/234,808 filed on Apr. 20, 2021, which applications are hereby incorporated herein by reference in their entirety.

TECHNICAL FIELD

The present invention relates to a luminous keyboard and a backlight module thereof.

BACKGROUND

A keyboard is a quite important input device for an electronic product (especially a computer), and the development of keyboards is closely related to the convenience of users. To operate keyboards smoothly in a dim environment, luminous keyboards have gradually become the first choice of consumers. Light is usually provided by using a backlight module in a luminous keyboard.

As shown in FIG. 1, in a conventional backlight module 80, a spacer 60, and a lower substrate 20 with a light source 30 are usually stacked to each other and fixed to a baseplate 10 of plural keyswitches (omitted) by adhesion layers 61. However, because the adhesion layers 61 are mostly made of light-transmissive materials, light emitted by the light source 30 may pass through the adhesion layers 61 to cause a light leakage phenomenon at a side edge of the backlight module 80.

Therefore, how to alleviate the light leakage phenomenon at the side edge of the backlight module is one of key points in the design of the luminous keyboard.

SUMMARY

The objective of the present invention is to provide a luminous keyboard and a backlight module thereof, to alleviate the light leakage phenomenon at the side edge of the backlight module.

The backlight module of the present invention includes a lower substrate, a spacer, at least one light source, and a shielding structure. The spacer has at least one spacer hole, and an outer edge gap is defined outside an outer edge of the spacer. The lower substrate is disposed below the spacer. The at least one light source is disposed on the lower substrate and located within the at least one spacer hole. The shielding structure is disposed outside the light source to at least partially block light provided by the light source from emitting towards the outer edge gap. An inner adhesion layer and an outer adhesion layer are disposed on a flat surface of the spacer, and at least one air gap is located between the first adhesion layer and the outer adhesion layer. The inner adhesion layer, the at least one air gap and the outer adhesion layer are aligned in series toward the outer edge gap to jointly form the shielding structure to reduce partial light of the light source from leaking out of the outer edge gap.

In an embodiment, the inner adhesion layer and the outer adhesion layer are disposed between the light source and the outer edge gap.

In an embodiment, the outer edge gap is of another air gap outside the outer adhesion layer.

In an embodiment, another air gap is defined between the light source and the inner adhesion layer.

In an embodiment, another air gap is defined between the outer adhesion layer and the outer edge gap.

In an embodiment, the inner adhesion layer, the air gap and the outer adhesion layer are located between the spacer and the lower substrate.

In an embodiment, the backlight module further includes a light masking sheet disposed above the light source, wherein a portion of the light masking sheet extending out of the outer edge gap further extends downward to form a portion of the shielding structure to shield the outer edge gap.

In an embodiment, the inner adhesion layer, the air gap and the outer adhesion layer are located between the light masking sheet and the spacer.

In another embodiment, the invention provides a backlight module including a lower substrate, at least one light source, a light guide sheet, an outer edge gap, and a shielding structure. The at least one light source is disposed on the lower substrate. The light guide sheet is disposed above the lower substrate and adjacent to the light source for guiding light. The outer edge gap is defined outside the light guide sheet. The shielding structure is disposed outside said light source to block light provided by the light source from emitting towards the outer edge gap. An inner adhesion layer and an outer adhesion layer are disposed on the lower substrate, and at least one air gap is located between the first adhesion layer and the outer adhesion layer. The inner adhesion layer, the at least one air gap and the outer adhesion layer are aligned in series toward the outer edge gap to jointly form the shielding structure to reduce partial light of the light source from leaking out of the outer edge gap.

In an embodiment, the inner adhesion layer, the air gap and the outer adhesion layer are located between the light masking sheet and the lower substrate.

In yet another embodiment, the invention provides a luminous keyboard including the backlight module described above and a key module. The key module includes a plurality of key units and a baseplate, wherein the plurality of key units are disposed on the baseplate.

DETAILED DESCRIPTION

Figure 1:
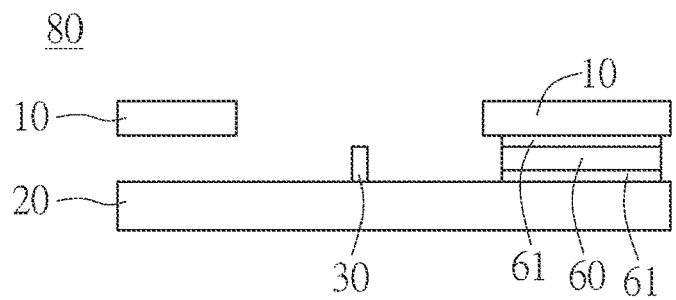
FIG. 1 is a schematic diagram of the prior art.

The present invention provides a luminous keyboard and a backlight module thereof, to prevent light from leaking at a side edge of the backlight module. The luminous keyboard of the present invention is applicable to a notebook computer, a standalone keyboard or any other electrical device with an imbedded keyboard module, but is not limited thereto. In an embodiment shown in FIG. 2, a luminous keyboard 900 includes the key module 700 and the backlight module 801. The key module 700 includes a plurality of key units 170, and a baseplate 100 disposed under the key units 170. The baseplate 100 is used as a support member of the key units 170. Generally, each of the key units 170 includes a keycap and a pair of supports (both not marked in FIG. 2) with the supports (scissor-type supports for example) being movably connected between the keycap and the baseplate 100 to support upward and downward movement of the keycaps. A membrane circuit (not shown) of the key units 170 may be configured above or underneath the baseplate 100 to generate key signals upon keystrokes of the key units 170. Baseplate holes 110 may be provided on the baseplate 100 (when embodied by an opaque material) corresponding to each key units 170, to allow light to pass toward the key units 170 and provide heat dissipation, or allow insertion of external fasteners (for example, screws and bolts).

Figure 2:
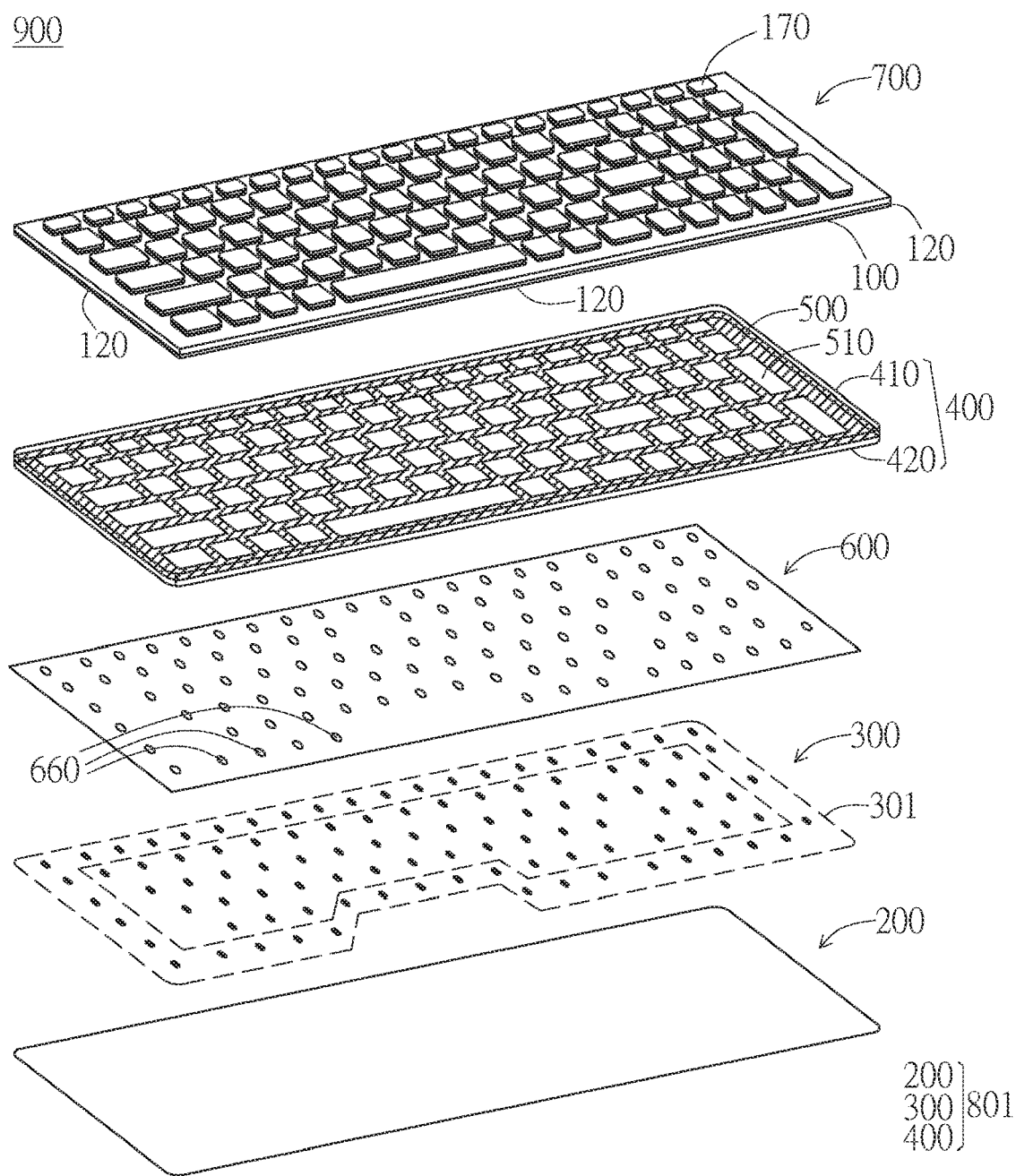
FIG. 2 is a schematic diagram of an embodiment of a luminous keyboard according to the present invention.

Specifically, in the embodiment shown in FIG. 2, the backlight module 801 includes a lower substrate 200, a plurality of light sources 300, a spacer 600 and a shielding structure 400. The lower substrate 200 is disposed below the baseplate 100, and the light sources 300 are disposed between the baseplate 100 and the lower substrate 200. In an embodiment shown in FIG. 3A, there is an outer edge gap 101 between an outer edge 120 of the baseplate 100 and the lower substrate 200. From a different point of view, the outer edge gap 101 is a gap between a portion of a surrounding side edge of the baseplate 100 and the lower substrate 200. The shielding structure 400 is disposed outside those of the light sources 300 distributed on a periphery (namely, light sources distributed on the periphery; those disposed along the inner peripheral of the baseplate may be deemed as periphery light sources 400), which is at one side relative to the outer edge 120 of the adjacent baseplate 100 to prevent light provided by the light sources 300 from being emitted out of the outer edge gap 101. The periphery light sources 300 are disposed at the periphery, which is a peripheral region 301 (referring to FIG. 2) close to a peripheral of the baseplate 100; each of the periphery light sources 300 is disposed in optical communication with at least one of the baseplate holes 110. In different embodiments, the shielding structure 400 is disposed at one side of the those of the periphery light sources 300 distributed on the periphery toward the outer edge gap 101, and may be located between a light source 300 and the outer edge gap 101, in the outer edge gap 101, or at the outer side of the entire backlight module 801.

Figure 3A:
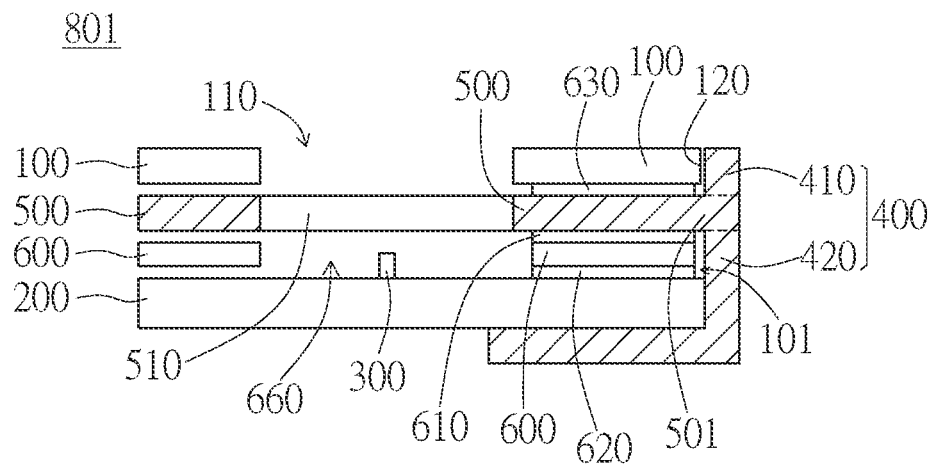
FIG. 3A and FIG. 3B are schematic diagrams of a first embodiment of a backlight module according to the present invention.

More specifically, in the embodiment shown in FIG. 3A, the lower substrate 200 includes a circuit layer coupled to the light source 300. The backlight module 801 further includes a light masking sheet 500 disposed between the baseplate 100 and the light source 300. A portion of the light masking sheet 500 extending out of the outer edge gap 101 then extends upward and downward respectively to form the shielding structure 400 to shield the outer edge gap 101. From a different point of view, the shielding structure 400 is connected to an end portion 501 of the light masking sheet 500 that extends out of the outer edge gap 101, the end portion 501 extends upward to form an upper masking portion 410 to shield a portion of the outer edge gap 101 which is located between the light masking sheet 500 and the baseplate 100, and the end portion 501 extends downward to form a lower masking portion 420 to shield a portion of the outer edge gap 101 which is located between the light masking sheet 500 and the lower substrate 200. In this way, the shielding structure 400 can prevent the light emitted by the light source 300 from being emitted out of the outer edge gap 101, that is, prevent the light from leaking at a side edge of the backlight module 801. Based on considerations such as increasing the masking effect or improving the mechanical strength, an end edge of the shielding structure 400, namely, an end edge of the lower masking portion 420, which is formed by the light masking sheet 500 extending out of the outer edge gap 101 and then extending downward, may be further bent inward below the lower substrate 200. That is, in this embodiment, the shielding structure 400 is formed by extension of the light masking sheet 500, and the corresponding upper masking portion 410 and lower masking portion 420 are formed by using bumping and bending techniques.

In the embodiment shown in FIG. 3A, the spacer 600 disposed between the light masking sheet 500 and the lower substrate 200, may only be located between those periphery light sources 300 distributed on the periphery and the outer edge 120 of the baseplate 100. As shown in FIG. 2, in some circumstances, each of the light sources 300 may be disposed in plural spacer holes 660 respectively, so as to protect light sources 300, and prevent light sources 300 from entering into baseplate holes 110 to interfere with any elements of key units 170, such as scissors supports, keycap hooks or membrane circuit components. For non-peripheral region, it is possible that multiple light sources 300 share one larger spacer hole 660. A first adhesion layer 610 is disposed between the light masking sheet 500 and the spacer 600, a second adhesion layer 620 is disposed between the spacer 600 and the lower substrate 200, and a third adhesion layer 630 is disposed between the baseplate 100 and the light masking sheet 500. Further, a common adhesion layer is made of a light-transmissive material, and light emitted by a light source may pass through the adhesion layer. The shielding structure 400 can prevent the light emitted by the light source 300 and passing through the first adhesion layer 610, the second adhesion layer 620, and the third adhesion layer 630 from being further emitted out of the outer edge gap 101 to outside of the side edge of the backlight module 801 (namely, prevent the light from leaking at a side edge of the luminous keyboard). The first adhesion layer 610, the second adhesion layer 620, and the third adhesion layer 630 may be further made of a light-proof material, to reduce light to pass through.

In the embodiments shown in FIG. 2 and FIG. 3A, the baseplate 100 is provided with a plurality of baseplate holes 110, and the light masking sheet 500 is provided with a plurality of light-transmissive portions 510. The light masking sheets 500 may be formed by printing ink on a film, and define the light-transmissive portions 510. Vertical projections of the periphery light sources 300 and the light-transmissive portions 510 on the baseplate 100 overlap with the baseplate holes 110. In other words, each baseplate hole 110 respectively corresponds to one light-transmissive portion 510 and one light source 300 below. However, in different embodiments, based on considerations such as increasing a light-exiting area and improving the light-exiting uniformity, the light source 300 may be used with a light guide element, and may not be disposed right below the baseplate hole 110 and the light-transmissive portion 510. In the drawings of FIGS. 3A/3B/3C/3D, 4A/4B, 5A/5B, 6A/6B, 7A/7B, 8A/8B, 9A/9B, 10A/10B, 11A/11B, 12A/12B, 13A/13B and 14A/14B, the range of the illustrated baseplate 100 and baseplate hole 110 and light source 300 corresponds to a single key unit 170. Although only one baseplate hole 110 is shown in these drawings, there may be plural baseplate holes 110 underneath a contour of a single key unit 170.

Figure 3B:
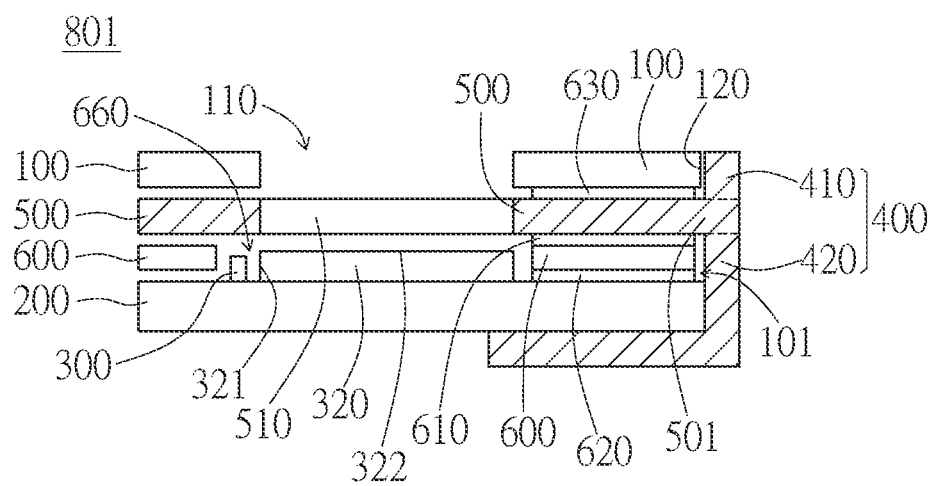

More specifically, in the embodiment shown in FIG. 3B, the backlight module 801 further includes a plurality of light guide sheets 320 (or an integrated one) respectively disposed at one side of one of the light sources 300 (namely, each light guide sheet 320 is disposed at one side of one of the light sources 300). Vertical projections of the each light guide sheet 320 and a corresponding light-transmissive portion 510 on the baseplate 100 overlap with a corresponding baseplate hole 110. In other words, each baseplate hole 110 respectively corresponds to one light-transmissive portion 510 and one light guide sheet 320 below. The light provided by the light source 300 is respectively emitted in from a side face 321 of an adjacent light guide sheet 320 and emitted out from a top face 322.

In different embodiments, the shielding structure 400 may vary according to considerations such as usage or manufacturing. In an embodiment shown in FIG. 3C and FIG. 3D, a lower substrate 200 is a circuit layer coupled to a light source 300, and a backlight module 802 further includes a light masking sheet 500 disposed between a baseplate 100 and the light source 300. The light masking sheet 500 is bent in an outer edge gap 101 to form a shielding structure 400 by using, for example, bumping and bending techniques.

Figure 3C:
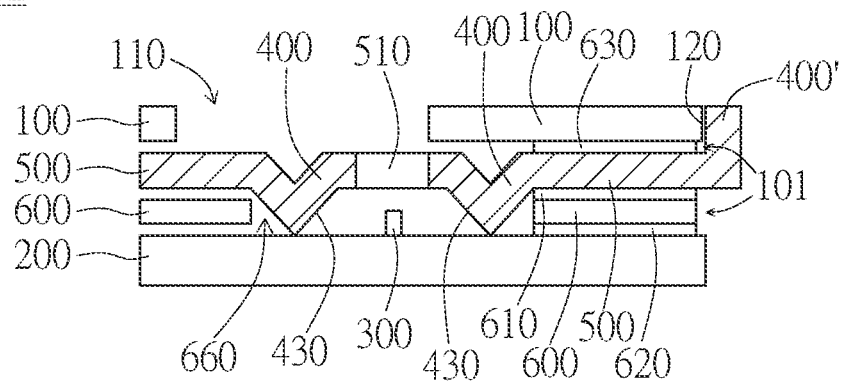
FIG. 3C and FIG. 3D are schematic diagrams of a second embodiment of a backlight module according to the present invention.

In the embodiment shown in FIG. 3C, the light masking sheet 500 is bent up and down in the outer edge gap 101 to form the shielding structure 400 (also referred to as a first shielding structure) with a V/U-shaped cross-section. The shielding structure 400 (namely, the first shielding structure) has an inclined shielding wall 430 facing toward the light source 300. The shielding wall 430 formed by a bent portion of the masking sheet 500 proximate to the peripheral light source 300 may be wide enough to block light toward one direction, or may selectively be a continuous wall surrounding all lateral sides of the peripheral light source 300 to block lights emitted towards any directions within a range of 360 degrees. Such shielding wall 430 may be disposed within the spacer hole 660. In this way, the shielding structure 400 (namely, the first shielding structure) can prevent light emitted by the light source 300 from being emitted out of the outer edge gap 101, that is, prevent the light from leaking at a side edge of the backlight module 802. Based on considerations such as increasing the masking effect or improving the mechanical strength, a manner in which the light masking sheet 500 is bent to form the shielding structure 400 (namely, the first shielding structure) may vary in different ways. On the other hand, because the shielding structure 400 (namely, the first shielding structure) is mainly formed between the light masking sheet 500 and the lower substrate 200 in this embodiment, a portion of the light masking sheet 500 extending out of the outer edge gap 101 may further extend upward to form a shielding structure 400' (also referred to as a second shielding structure) to shield a portion of the outer edge gap 101 which is located between the light masking sheet 500 and the baseplate 100, and prevent the light from being emitted out from a gap between the light masking sheet 500 and the baseplate 100. In this embodiment, the light masking sheet 500 is bent at both sides of the light source 300 to form the shielding structure 400 (namely, the first shielding structure). However, in different embodiments, the light masking sheet 500 may also be bent at only one side of the light source 300 to form the shielding structure 400 (namely, the first shielding structure).

In the embodiment shown in FIG. 3C, the backlight module 802 further includes a spacer 600, disposed between the light masking sheet 500 and the lower substrate 200, and located between the shielding structure 400 and an outer edge 120 of the baseplate 100. A first adhesion layer 610 is disposed between the light masking sheet 500 and the spacer 600, a second adhesion layer 620 is disposed between the spacer 600 and the lower substrate 100, and a third adhesion layer 630 is disposed between the baseplate 100 and the light masking sheet 500. Further, a common adhesion layer is made of a light-transmissive material, and light emitted by a light source may pass through the adhesion layer. The shielding structure 400 can prevent the light emitted by the light source 300 from passing through the first adhesion layer 610 and the second adhesion layer 620 and being emitted out from the outer edge gap 101 to outside of the side edge of the backlight module 802. The shielding structure 400' can prevent the light emitted by the light source 300 from passing through the third adhesion layer 630 and being emitted out from the outer edge gap 101 to outside of the side edge of the backlight module 802. The first adhesion layer 610, the second adhesion layer 620, and the third adhesion layer 630 may be further made of a light-proof material, to reduce light to pass through.

In the embodiment shown in FIG. 3C, the baseplate 100 is provided with a plurality of baseplate holes 110, and the light masking sheet 500 is provided with a plurality of light-transmissive portions 510. The light masking sheets 500 may be formed by printing ink on a film, and define the light-transmissive portions 510. Vertical projections of the light sources 300 and the light-transmissive portions 510 on the baseplate 100 overlap with the baseplate holes 110. In other words, each baseplate hole 110 respectively corresponds to one light-transmissive portion 510 and one light source 300 below. However, in different embodiments, based on considerations such as increasing a light-exiting area and improving the light-exiting uniformity, the light source 300 may be used with a light guide element, and may not be disposed right below the baseplate hole 110 and the light-transmissive portion 510.

Figure 3D:
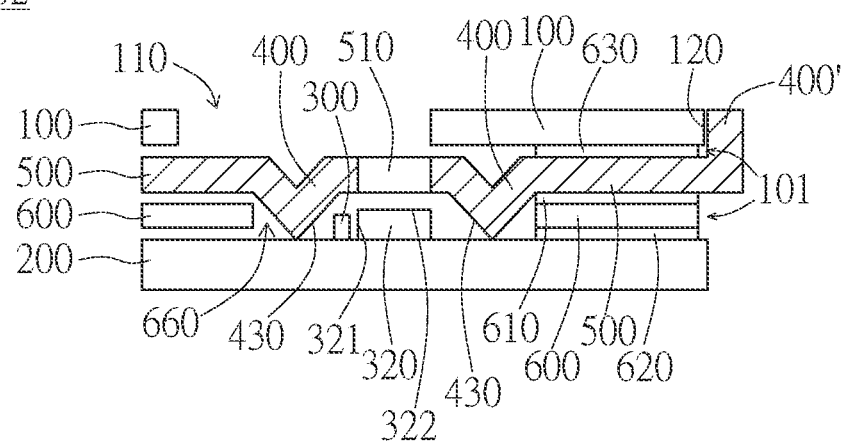

More specifically, in the embodiment shown in FIG. 3D, the backlight module 802 further includes a plurality of light guide sheets 320 (or an integrated one) respectively disposed at one side of one of the light sources 300, and vertical projections of each light guide sheet 320 and a corresponding light-transmissive portion 510 on the baseplate 100 overlap with a corresponding baseplate hole 110. In other words, each baseplate hole 110 respectively corresponds to one light-transmissive portion 510 and one light guide sheet 320 below. The light provided by the light source 300 is respectively emitted in from a side face 321 of an adjacent light guide sheet 320 and emitted out from a top face 322.

In different embodiments shown in FIG. 4A to FIG. 5B, a lower substrate 200 is a light reflector, to support upward reflection of light emitted by a light source 300. A backlight module 803 further includes a circuit layer 220 disposed between a baseplate 100 and a plurality of light sources 300 and coupled to the light sources 300. The lower substrate 200 extends toward an outer edge 120 of the baseplate 100 to form a shielding structure 400 to shield an outer edge gap 101.

Figure 4A:
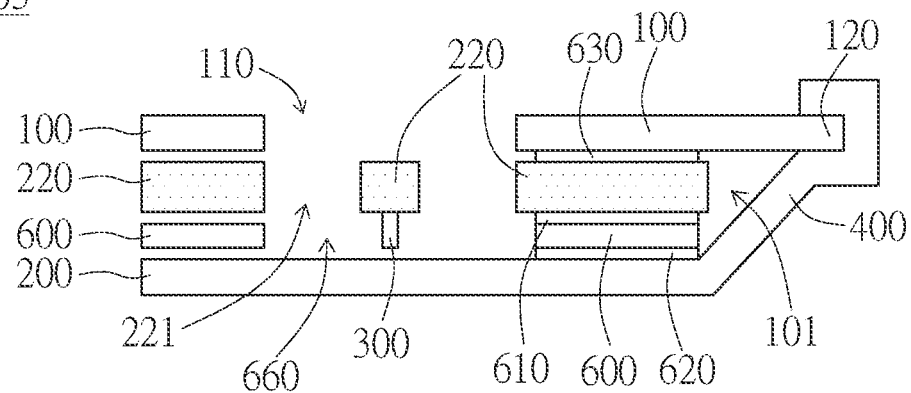
FIG. 4A and FIG. 4B are schematic diagrams of a third embodiment of a backlight module according to the present invention.

More specifically, in an embodiment shown in FIG. 4A, the lower substrate 200 extends toward the outer edge 120 of the baseplate 100 to form a shielding structure 400 with an inclined surface to shield the outer edge gap 101. In this way, the shielding structure 400 can prevent the light emitted by the light source 300 from being emitted out of the outer edge gap 101, that is, prevent the light from leaking at a side edge of a backlight module 803. Based on considerations such as increasing the masking effect or improving the mechanical strength, an end edge of the shielding structure 400 may be further formed by bending by using a bending technology and cover the outer edge 120 of the baseplate 100.

In the embodiment shown in FIG. 4A, the backlight module 803 further includes a spacer 600, disposed between the circuit layer 220 and the lower substrate 200, and located between those periphery light sources 300 distributed on a periphery and the outer edge 120 of the baseplate 100. A first adhesion layer 610 is disposed between the circuit layer 220 and the spacer 600, a second adhesion layer 620 is disposed between the spacer 600 and the lower substrate 200, and a third adhesion layer 630 is disposed between the baseplate 100 and the circuit layer 220. Further, a common adhesion layer is made of a light-transmissive material, and light emitted by a light source may pass through the adhesion layer. The shielding structure 400 can prevent the light emitted by the light source 300 and passing through the first adhesion layer 610, the second adhesion layer 620, and the third adhesion layer 630 from being further emitted out from the outer edge gap 101 to outside of the side edge of the backlight module 803. The first adhesion layer 610, the second adhesion layer 620, and the third adhesion layer 630 may be further made of a light-proof material, to reduce light to pass through.

In the embodiment shown in FIG. 4A, the baseplate 100 is provided with a plurality of baseplate holes 110, and the circuit layer 220 is provided with a plurality of circuit layer holes 221. For example, the circuit layer hole 221 may be formed in a breaching manner. Vertical projections of the periphery light sources 300 and the circuit layer holes 221 on the baseplate 100 overlap with the baseplate holes 110. In other words, each baseplate hole 110 respectively corresponds to one circuit layer hole 221 and one light source 300 below. However, in different embodiments, based on considerations such as increasing the light-exiting area and improving the light-exiting uniformity, the light source 300 may be used with a light guide element, and may not be disposed right below the baseplate hole 110 and the circuit layer hole 221.

Figure 4B:
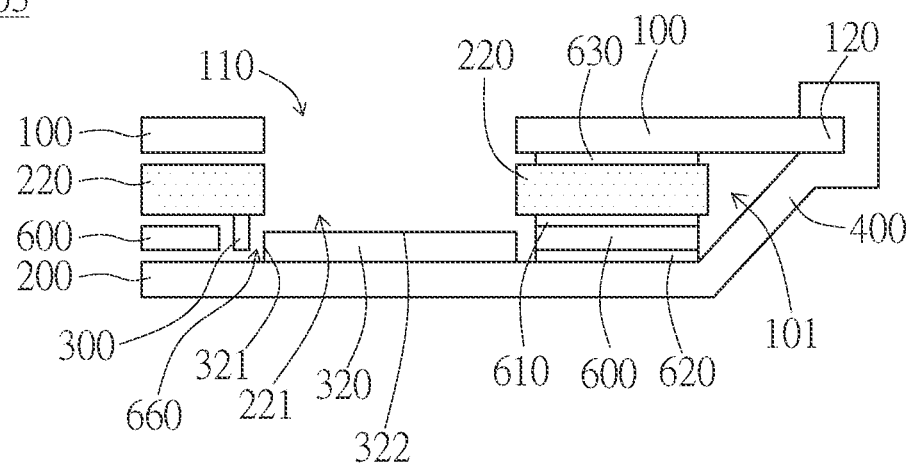
Figure 5A:
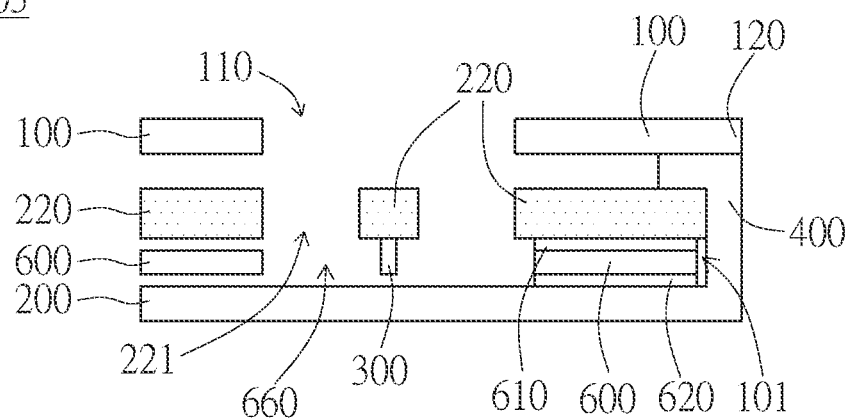
FIG. 5A and FIG. 5B are schematic diagrams of a fourth embodiment of a backlight module according to the present invention.
Figure 5B:
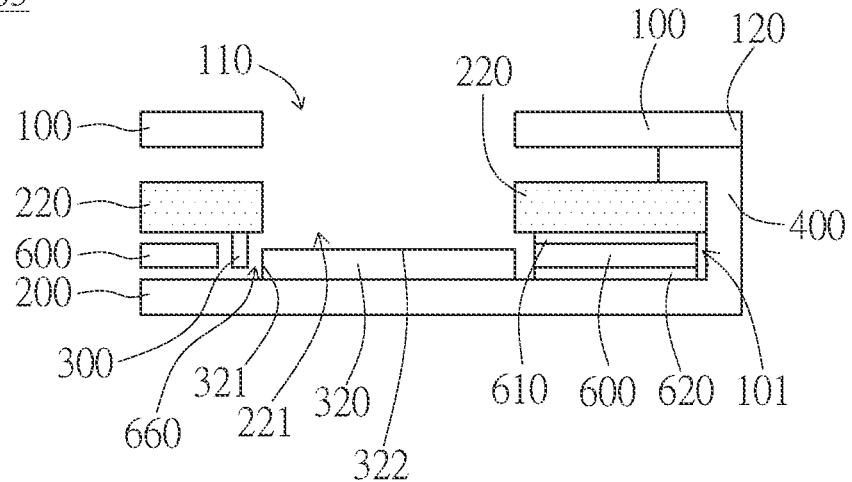

More specifically, in the embodiment shown in FIG. 4B, the backlight module 803 further includes a plurality of light guide sheets 320 (or an integrated one) respectively disposed at one side of one of the light sources 300, and a vertical projection of each light guide sheet 320 on the circuit layer 220 overlaps with a corresponding circuit layer hole 221. In other words, each baseplate hole 110 respectively corresponds to one circuit layer hole 221 and one light guide sheet 320 below. The light provided by the light source 300 is respectively emitted in from a side face 321 of an adjacent light guide sheet 320 and emitted out from a top face 322.

A manner in which the lower substrate 200 extends toward the outer edge 120 of the baseplate 100 to form the shielding structure 400 may vary according to considerations such as usage or manufacturing. In an embodiment shown in FIG. 5A and FIG. 5B, an end edge of the shielding structure 400 is bent inward to extend between the baseplate 100 and the circuit layer 220. More specifically, a portion of the lower substrate 200 extending out of the outer edge gap 101 then extends upward to form the shielding structure 400 to shield the outer edge gap 101. In this way, the shielding structure 400 can prevent the light emitted by the light source 300 from being emitted out of the outer edge gap 101, that is, prevent the light from leaking at a side edge of a backlight module 803. Based on considerations such as increasing the masking effect or improving the mechanical strength, the end edge of the shielding structure 400 may be further bent inward to extend between the baseplate 100 and the circuit layer 220 by using, for example, bumping and bending techniques.

In different embodiments shown in FIG. 6A to FIG. 7B, a lower substrate 200 is a circuit layer coupled to a plurality of light sources 300, and an upper end edge 401 and a lower end edge 402 of a shielding structure 400 are respectively connected to a baseplate 100 and the lower substrate 200. More specifically, in an embodiment shown in FIG. 6A, the shielding structure 400 may be an electrical element or a non-electrical element such as a zero-ohm resistor, and is connected to the lower substrate 200 in a mounting manner and abuts against the baseplate 100, but is not limited thereto. In this way, the shielding structure 400 can prevent the light emitted by the light source 300 from being emitted out of the outer edge gap 101, that is, prevent the light from leaking at a side edge of a backlight module 804.

Figure 6A:
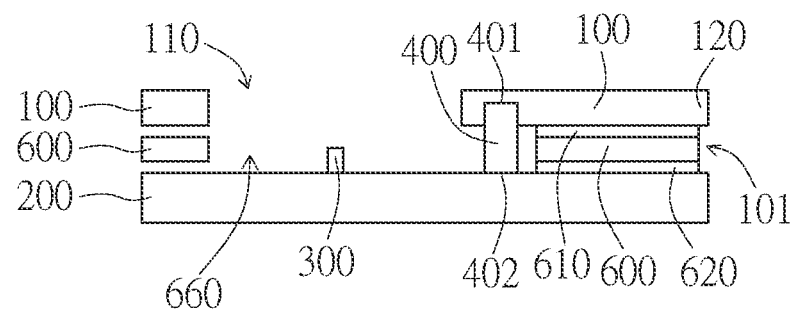
FIG. 6A and FIG. 6B are schematic diagrams of a fifth embodiment of a backlight module according to the present invention.

In the embodiment shown in FIG. 6A, the backlight module 804 further includes a spacer 600, disposed between the baseplate 100 and the lower substrate 200, and located between the shielding structure 400 and an outer edge 120 of the baseplate 100. A first adhesion layer 610 is disposed between the baseplate 100 and the spacer 600, and a second adhesion layer 620 is disposed between the spacer 600 and the lower substrate 200. Further, a common adhesion layer is made of a light-transmissive material, and light emitted by a light source may pass through the adhesion layer. The shielding structure 400 can prevent the light emitted by the light source 300 from passing through the first adhesion layer 610 and the second adhesion layer 620 and being emitted out from the outer edge gap 101 to outside of the side edge of the backlight module 804. The first adhesion layer 610 and the second adhesion layer 620 may be further made of a light-proof material, to reduce light to pass through.

In the embodiment shown in FIG. 6A, the baseplate 100 is provided with a plurality of baseplate holes 110, and vertical projections of the light sources 300 on the baseplate 100 overlap with the baseplate holes 110. In other words, each baseplate hole 110 respectively corresponds to one light source 300 below. However, in different embodiments, based on considerations such as increasing the light-exiting area and improving the light-exiting uniformity, the light source 300 may be used with a light guide element, and may not be disposed right below the baseplate hole 110.

Figure 6B:
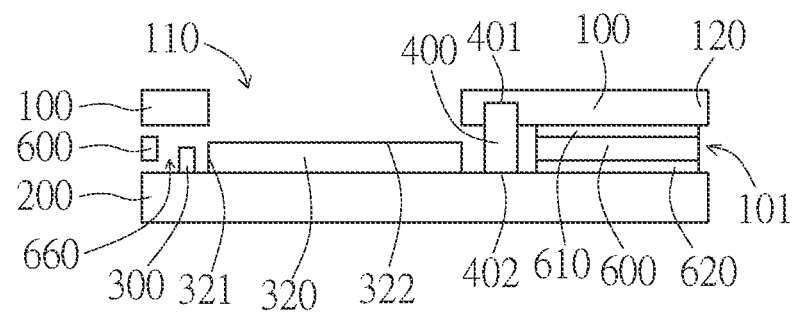

More specifically, in the embodiment shown in FIG. 6B, the backlight module 804 further includes a plurality of light guide sheets 320 (or an integrated one) respectively disposed at one side of one of the light sources 300. A vertical projection of each light guide sheet 320 on the baseplate 100 overlaps with a corresponding baseplate hole 110. In other words, each baseplate hole 110 respectively corresponds to one light guide sheet 320 below. The light provided by the light source 300 is respectively emitted in from a side face 321 of an adjacent light guide sheet 320 and emitted out from a top face 322.

Figure 7A:
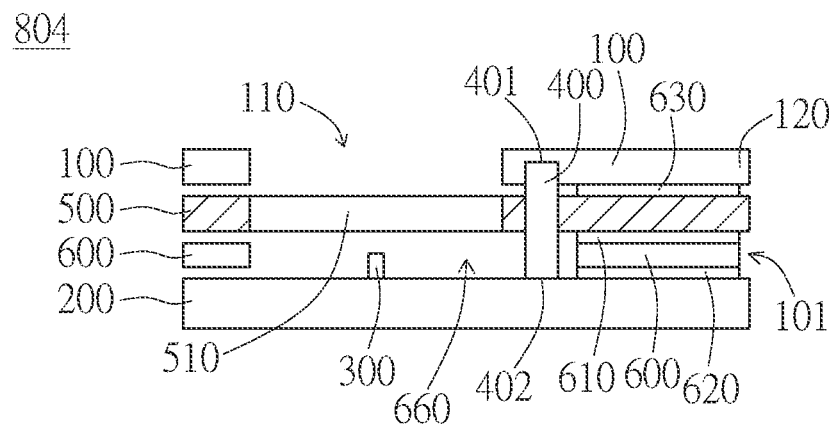
FIG. 7A and FIG. 7B are schematic diagrams of a sixth embodiment of a backlight module according to the present invention.
Figure 7B:
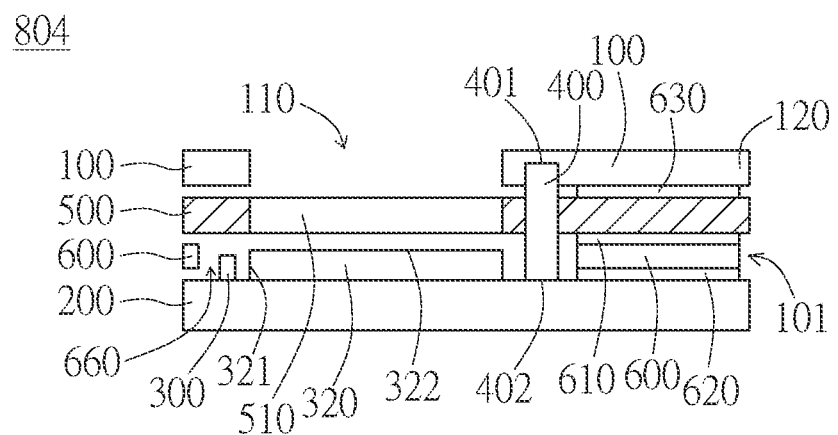

In an embodiment shown in FIG. 7A and FIG. 7B, the backlight module 804 further includes a light masking sheet 500 disposed between the baseplate 100 and the spacer 600 and located above the light sources 300. The shielding structure 400 penetrates the light masking sheet 500 so that the upper end edge 401 and the lower end edge 402 are respectively connected to the baseplate 100 and the lower substrate 200.

In the embodiment shown in FIG. 7A, the spacer 600 is disposed between the light masking sheet 500 and the lower substrate 200, and is located between the shielding structure 400 and the outer edge 120 of the baseplate 100. A first adhesion layer 610 is disposed between the light masking sheet 500 and the spacer 600, a second adhesion layer 620 is disposed between the spacer 600 and the lower substrate 200, and a third adhesion layer 630 is disposed between the baseplate 100 and the light masking sheet 500. Further, a common adhesion layer is made of a light-transmissive material, and light emitted by a light source may pass through the adhesion layer. The shielding structure 400 can prevent the light emitted by the light source 300 from passing through the first adhesion layer 610, the second adhesion layer 620, and the third adhesion layer 630 and being emitted out from the outer edge gap 101 to outside of the side edge of the backlight module 804. The first adhesion layer 610, the second adhesion layer 620, and the third adhesion layer 630 may be further made of a light-proof material, to reduce light to pass through.

In the embodiment shown in FIG. 7A, the baseplate 100 is provided with a plurality of baseplate holes 110, and the light masking sheet 500 is provided with a plurality of light-transmissive portions 510. The light masking sheets 500 may be formed by printing ink on a film, and define the light-transmissive portions 510. Vertical projections of the light sources 300 and the light-transmissive portions 510 on the baseplate 100 overlap with the baseplate holes 110. In other words, each baseplate hole 110 respectively corresponds to one light-transmissive portion 510 and one light source 300 below. However, in different embodiments, based on considerations such as increasing a light-exiting area and improving the light-exiting uniformity, the light source 300 may be used with a light guide element, and may not be disposed right below the baseplate hole 110 and the light-transmissive portion 510.

More specifically, in the embodiment shown in FIG. 7B, the backlight module 804 further includes a plurality of light guide sheets 320 (or an integrated one) respectively disposed at one side of one of the light sources 300. Vertical projections of a light guide sheet 320 and a light-transmissive portion 510 on the baseplate 100 overlap with the baseplate hole 110. In other words, each baseplate hole 110 respectively corresponds to one light-transmissive portion 510 and one light guide sheet 320 below. The light provided by the light source 300 is respectively emitted in from a side face 321 of an adjacent light guide sheet 320 and emitted out from a top face 322.

Figure 8A:
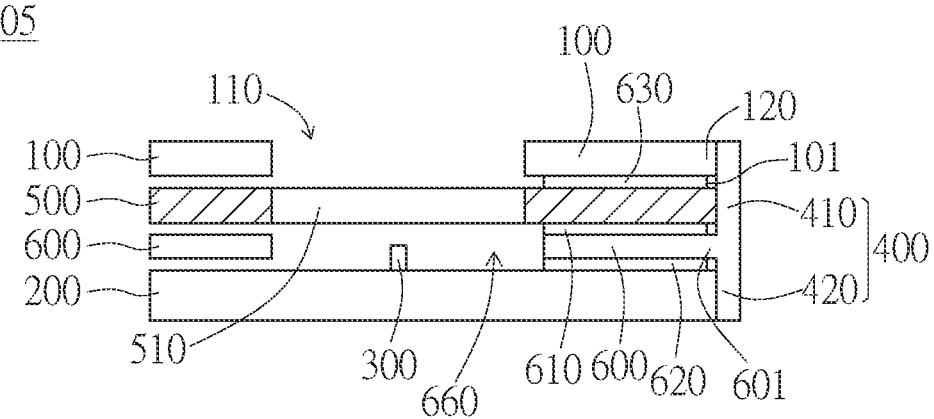
FIG. 8A and FIG. 8B are schematic diagrams of a seventh embodiment of a backlight module according to the present invention.
Figure 8B:
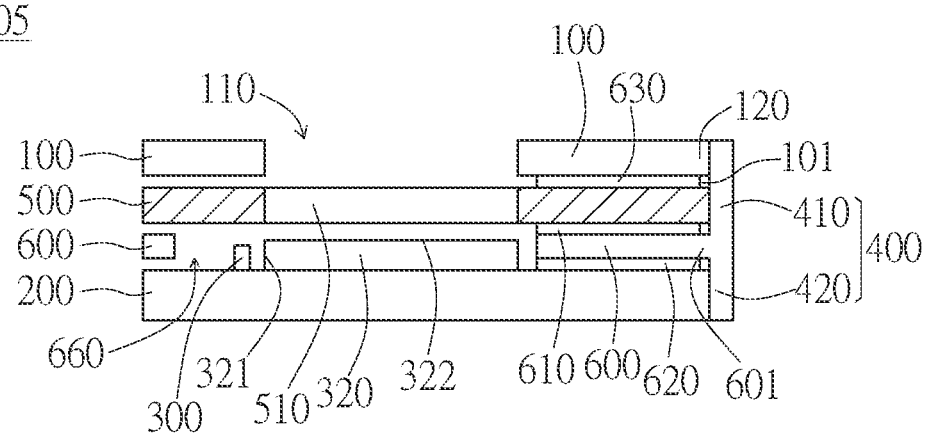

In different embodiments shown in FIG. 8A and FIG. 8B, a backlight module 805 further includes a spacer 600 disposed between a baseplate 100 and a lower substrate 200, and located between those of a plurality of light sources 300 distributed on a periphery and an outer edge 120 of the baseplate 100. A portion of the spacer 600 extending out of an outer edge gap 101 then extends upward and downward respectively to form a shielding structure 400 to shield the outer edge gap 101. From a different point of view, the shielding structure 400 is connected to an end portion 601 of the spacer 600 which extends out of the outer edge gap 101, the end portion 601 extends upward to form an upper masking portion 410 to shield a portion of the outer edge gap 101 which is located between the spacer 600 and the baseplate 100, and the end portion 601 extends downward to form a lower masking portion 420 to shield a portion of the outer edge gap 101 which is located between the spacer 600 and the lower substrate 200. That is, in this embodiment, the shielding structure 400 is formed by extension of the spacer 600, and the corresponding upper masking portion 410 and lower masking portion 420 are formed by using bumping and bending techniques. In this way, the shielding structure 400 can prevent the light emitted by the light source 300 from being emitted out of the outer edge gap 101, that is, prevent the light from leaking at a side edge of a backlight module 805.

In an embodiment shown in FIG. 8A, the backlight module 805 further includes a light masking sheet 500 disposed between the baseplate 100 and the spacer 600 and located above the periphery light sources 300. A first adhesion layer 610 is disposed between the light masking sheet 500 and the spacer 600, a second adhesion layer 620 is disposed between the spacer 600 and the lower substrate 200, and a third adhesion layer 630 is disposed between the baseplate 100 and the light masking sheet 500. Further, a common adhesion layer is made of a light-transmissive material, and light emitted by a light source may pass through the adhesion layer. The shielding structure 400 can prevent the light emitted by the light source 300 and passing through the first adhesion layer 610, the second adhesion layer 620, and the third adhesion layer 630 from being further emitted out from the outer edge gap 101 to outside of the side edge of the backlight module 805. The first adhesion layer 610, the second adhesion layer 620, and the third adhesion layer 630 may be further made of a light-proof material, to reduce light to pass through.

In the embodiment shown in FIG. 8A, the baseplate 100 is provided with a plurality of baseplate holes 110, and the light masking sheet 500 is provided with a plurality of light-transmissive portions 510. The light masking sheets 500 may be formed by printing ink on a film, and define the light-transmissive portions 510. Vertical projections of the light sources 300 and the light-transmissive portions 510 on the baseplate 100 overlap with the baseplate holes 110. In other words, each baseplate hole 110 respectively corresponds to one light-transmissive portion 510 and one light source 300 below. However, in different embodiments, based on considerations such as increasing a light-exiting area and improving the light-exiting uniformity, the light source 300 may be used with a light guide element, and may not be disposed right below the baseplate hole 110 and the light-transmissive portion 510.

More specifically, in the embodiment shown in FIG. 8B, the backlight module 805 further includes a plurality of light guide sheets 320 (or an integrated one) respectively disposed at one side of one of the light sources 300. Vertical projections of the each light guide sheet 320 and a corresponding light-transmissive portion 510 on the baseplate 100 overlap with a corresponding baseplate hole 110. In other words, each baseplate hole 110 respectively corresponds to one light-transmissive portion 510 and one light guide sheet 320 below. The light provided by the light source 300 is respectively emitted in from a side face 321 of an adjacent light guide sheet 320 and emitted out from a top face 322.

In different embodiments shown in FIG. 9A to FIG. 10B, a portion of a baseplate 100 extends downward to form a shielding structure 400. More specifically, in an embodiment shown in FIG. 9A, a portion of the baseplate 100 extending out of an outer edge gap 101 then extends downward to form the shielding structure 400 to shield the outer edge gap 101. In this way, the shielding structure 400 can prevent the light emitted by the light source 300 from being emitted out of the outer edge gap 101, that is, prevent the light from leaking at a side edge of a backlight module 806.

Figure 9A:
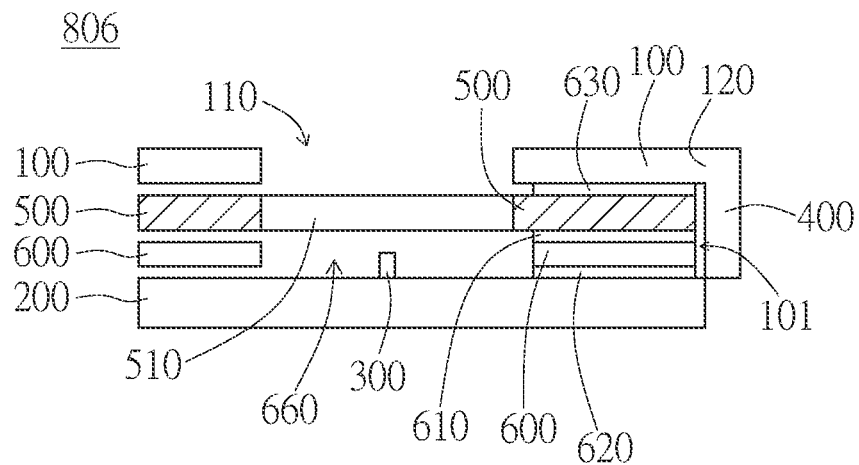
FIG. 9A and FIG. 9B are schematic diagrams of an eighth embodiment of a backlight module according to the present invention.

In the embodiment shown in FIG. 9A, the backlight module 806 further includes a spacer 600, disposed between the baseplate 100 and a lower substrate 200, and located between those periphery light sources 300 distributed on a periphery and an outer edge 120 of the baseplate 100. A first adhesion layer 610 is disposed between the light masking sheet 500 and the spacer 600, a second adhesion layer 620 is disposed between the spacer 600 and the lower substrate 200, and a third adhesion layer 630 is disposed between the baseplate 100 and the light masking sheet 500. Further, a common adhesion layer is made of a light-transmissive material, and light emitted by a light source may pass through the adhesion layer. The shielding structure 400 can prevent the light emitted by the light source 300 and passing through the first adhesion layer 610, the second adhesion layer 620, and the third adhesion layer 630 from being further emitted out from the outer edge gap 101 to outside of the side edge of the backlight module 806. The first adhesion layer 610, the second adhesion layer 620, and the third adhesion layer 630 may be further made of a light-proof material, to reduce light to pass through.

In the embodiment shown in FIG. 9A, the baseplate 100 is provided with a plurality of baseplate holes 110, and the light masking sheet 500 is provided with a light-transmissive portions 510. The light masking sheets 500 may be formed by printing ink on a film, and define the light-transmissive portions 510. Vertical projections of the light sources 300 and the light-transmissive portions 510 on the baseplate 100 overlap with the baseplate holes 110. In other words, each baseplate hole 110 respectively corresponds to one light-transmissive portion 510 and one light source 300 below. However, in different embodiments, based on considerations such as increasing a light-exiting area and improving the light-exiting uniformity, the light source 300 may be used with a light guide element, and may not be disposed right below the baseplate hole 110 and the light-transmissive portion 510.

Figure 9B:
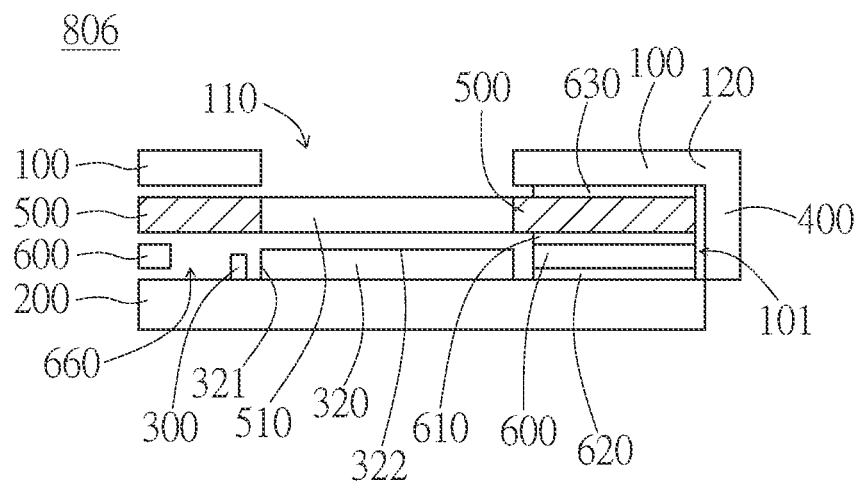
Figure 10A:
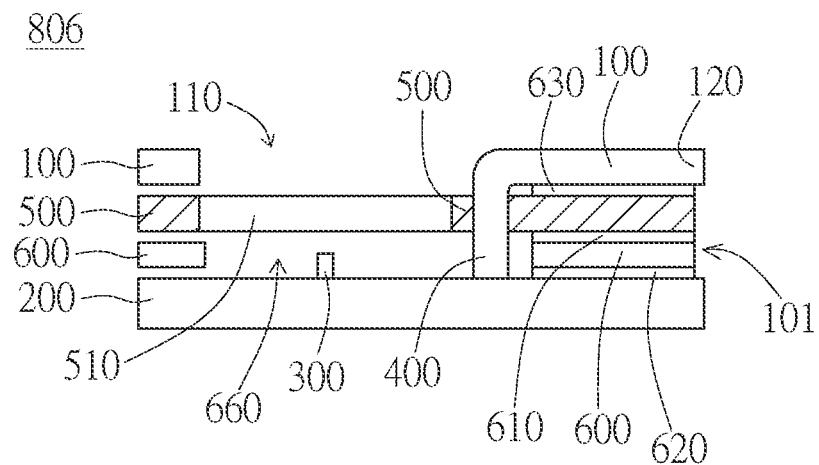
FIG. 10A and FIG. 10B are schematic diagrams of a ninth embodiment of a backlight module according to the present invention.
Figure 10B:
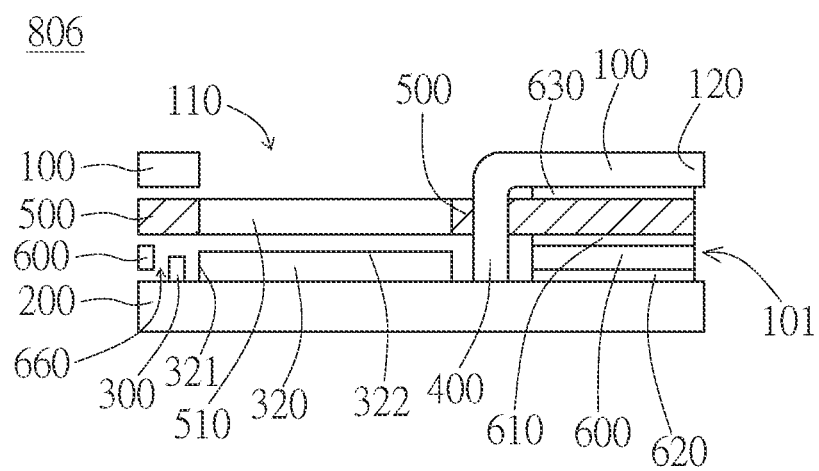

More specifically, in the embodiment shown in FIG. 9B, the backlight module 806 further includes a plurality of light guide sheets 320 (or an integrated one) respectively disposed at one side of one of the light sources 300. Vertical projections of the each light guide sheet 320 and a corresponding light-transmissive portion 510 on the baseplate 100 overlap with a corresponding baseplate hole 110. In other words, each baseplate hole 110 respectively corresponds to one light-transmissive portion 510 and one light guide sheet 320 below. The light provided by the light source 300 is respectively emitted in from a side face 321 of an adjacent light guide sheet 320 and emitted out from a top face 322.

A manner in which the portion of the baseplate 100 extends downward to form the shielding structure 400 may vary according to considerations such as usage or manufacturing. In an embodiment shown in FIG. 10A and FIG. 10B, a portion of the baseplate 100 extends downward to form the shielding structure 400 which is located between the those periphery light sources 300 distributed on the periphery and the spacer 600 and is connected to the lower substrate 200. More specifically, in this embodiment, the shielding structure 400 is a downward bent tongue piece of the baseplate 100 which is formed by for example, stamping. In this way, the shielding structure 400 can prevent the light emitted by the light source 300 from being emitted into the first adhesion layer 610, the second adhesion layer 620, and the third adhesion layer 630, and further prevent the light from being emitted out of the outer edge gap 101, that is, prevent the light from leaking at the side edge of the backlight module 806. An end edge of the shielding structure 400 is connected to the lower substrate 200 in, for example, an abutting or insertion manner.

Figure 11A:
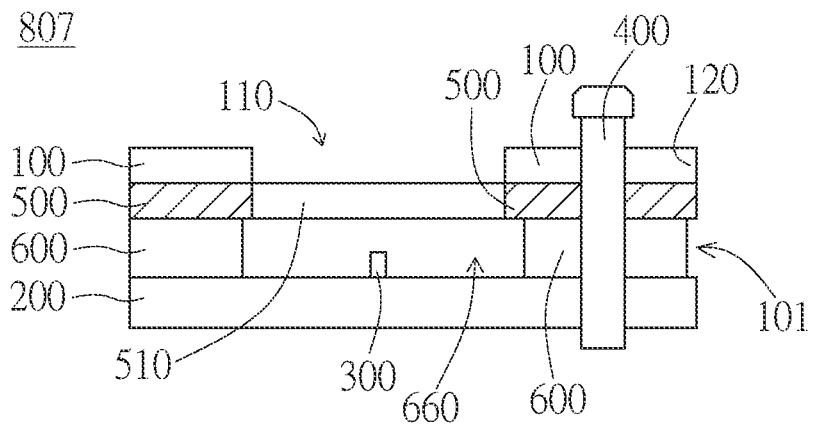
FIG. 11A and FIG. 11B are schematic diagrams of a tenth embodiment of a backlight module according to the present invention.
Figure 11B:
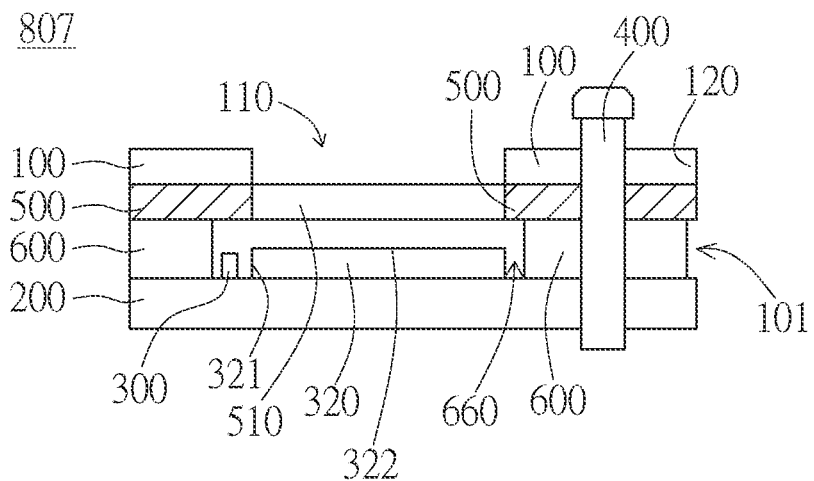

In different embodiments shown in FIG. 11A and FIG. 11B, a backlight module 807 further includes a spacer 600, disposed between a baseplate 100 and a lower substrate 200, and located between those periphery light sources 300 distributed on a periphery and an outer edge 120 of the baseplate 100. A shielding structure 400 of a screw, a rivet, a hot melt glue, or the like penetrates and fixes the baseplate 100, the spacer 600, and the lower substrate 200. In other words, in this embodiment, the fixing effect can be achieved without using an adhesion layer. In this way, there is no adhesion layer for light to pass through, and even though the baseplate 100, the spacer 600, and the lower substrate 200 are not completely sealed, the shielding structure 400 located between the periphery light sources 300 and an outer edge gap 101 can prevent light emitted by the periphery light sources 300 from being emitted out of the outer edge gap 101, that is, prevent the light from leaking at a side edge of the backlight module 807.

In the embodiments shown in FIG. 11A and FIG. 11B, the backlight module 807 further includes a light masking sheet 500 disposed between the baseplate 100 and the spacer 600 and located above the periphery light sources 300. The shielding structure 400 penetrates and fixes the baseplate 100, the light masking sheet 500, the spacer 600, and the lower substrate 200.

In the embodiment shown in FIG. 11A, the baseplate 100 is provided with a plurality of baseplate holes 110, and the light masking sheet 500 is provided with a plurality of light-transmissive portions 510. The light masking sheets 500 may be formed by printing ink on a film, and define the light-transmissive portions 510. Vertical projections of the periphery light sources 300 and the light-transmissive portions 510 on the baseplate 100 overlap with the baseplate holes 110. In other words, each baseplate hole 110 respectively corresponds to one light-transmissive portion 510 and one light source 300 below. However, in different embodiments, based on considerations such as increasing a light-exiting area and improving the light-exiting uniformity, the light source 300 may be used with a light guide element, and may not be disposed right below the baseplate hole 110 and the light-transmissive portion 510.

More specifically, in the embodiment shown in FIG. 11B, the backlight module 807 further includes a plurality of light guide sheets 320 (or an integrated one) respectively disposed at one side of one of the periphery light sources 300. Vertical projections of the each light guide sheet 320 and a corresponding light-transmissive portion 510 on the baseplate 100 overlap with a corresponding baseplate hole 110. In other words, each baseplate hole 110 respectively corresponds to one light-transmissive portion 510 and one light guide sheet 320 below. The light provided by the light source 300 is respectively emitted in from a side face 321 of an adjacent light guide sheet 320 and emitted out from a top face 322.

Figure 12A:
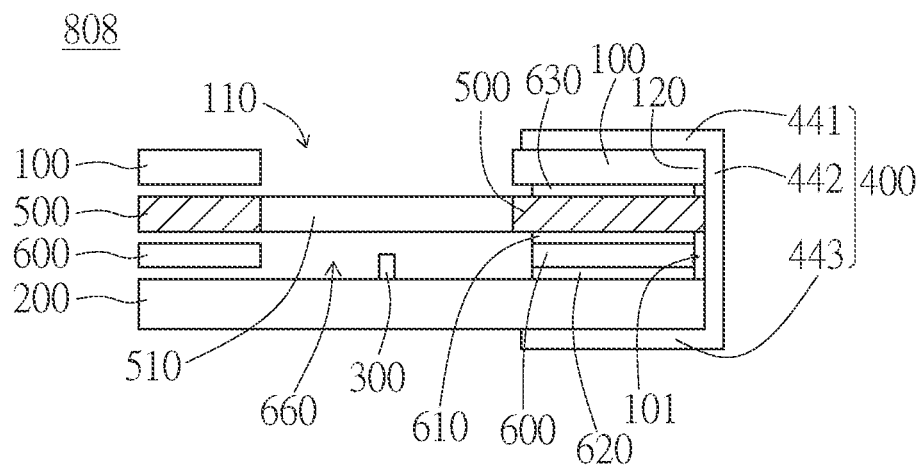
FIG. 12A and FIG. 12B are schematic diagrams of an eleventh embodiment of a backlight module according to the present invention.
Figure 12B:
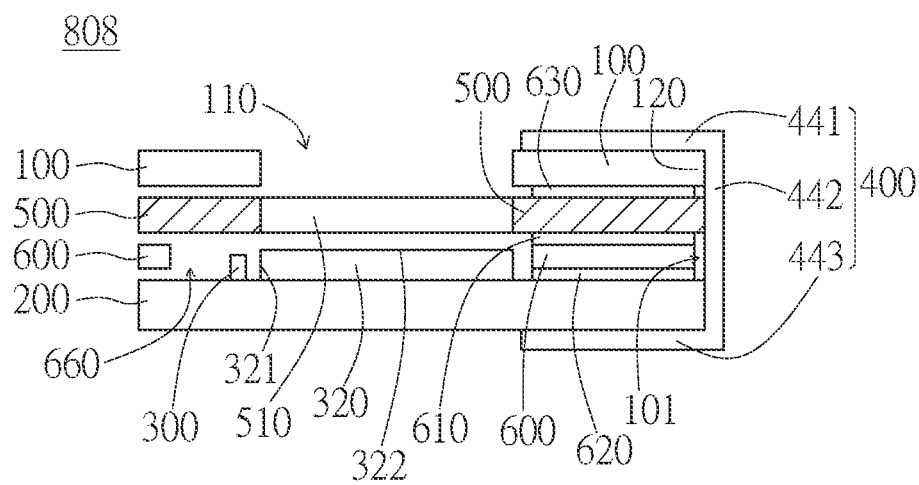

In different embodiments shown in FIG. 12A and FIG. 12B, a shielding structure 400 is a fastener with a U-shaped cross-section, and the shielding structure 400 may be fastened to an outer edge 120 of a baseplate 100 to shield an outer edge gap 101, and enable that opposite end edges of the shielding structure 400 are respectively located on the baseplate 100 and under a lower substrate 200. From a different point of view, an upper portion 441 of the shielding structure 400 is disposed on an upper surface of the baseplate 100, extends outward to exceed the outer edge 120 of the baseplate 100 and then extends downward to form a middle portion 442, and extends downward to exceed the lower substrate 200 and then extends inward to a lower surface of the lower substrate 200 to form a lower portion 443. The upper portion 441 and the lower portion 443 at least partially abut against the upper surface of the baseplate 100 and the lower surface of the lower substrate 200 respectively through rigidity of the shielding structure 400 itself (namely, the upper portion 441 at least partially abuts against the upper surface of the baseplate 100 through the rigidity of the shielding structure 400 itself, and the lower portion 443 at least partially abuts against the lower surface of the lower substrate 200 through the rigidity of the shielding structure 400 itself), so that the shielding structure 400 is fastened and fixed on the outer edge 120 of the baseplate 100. In this way, the shielding structure 400 can prevent the light emitted by the light source 300 from being emitted out of the outer edge gap 101, that is, prevent the light from leaking at a side edge of a backlight module 808.

In an embodiment shown in FIG. 12A, the backlight module 808 further includes a spacer 600, disposed between the baseplate 100 and the lower substrate 200, and located between those periphery light sources 300 distributed on a periphery and the outer edge 120 of the baseplate 100. The backlight module 808 further includes a light masking sheet 500 disposed between the baseplate 100 and the spacer 600. A first adhesion layer 610 is disposed between the light masking sheet 500 and the spacer 600, a second adhesion layer 620 is disposed between the spacer 600 and the lower substrate 200, and a third adhesion layer 630 is disposed between the baseplate 100 and the light masking sheet 500. Further, a common adhesion layer is made of a light-transmissive material, and light emitted by a light source may pass through the adhesion layer. The shielding structure 400 can prevent the light emitted by the light source 300 and passing through the first adhesion layer 610, the second adhesion layer 620, and the third adhesion layer 630 from being further emitted out from the outer edge gap 101 to outside of the side edge of the backlight module 808. The first adhesion layer 610, the second adhesion layer 620, and the third adhesion layer 630 may be further made of a light-proof material, to reduce light to pass through.

In the embodiment shown in FIG. 12A, the baseplate 100 is provided with a plurality of baseplate holes 110, and the light masking sheet 500 is provided with a plurality of light-transmissive portions 510. The light masking sheets 500 may be formed by printing ink on a film, and define the light-transmissive portions 510. Vertical projections of the periphery light sources 300 and the light-transmissive portions 510 on the baseplate 100 overlap with the baseplate holes 110. In other words, each baseplate hole 110 respectively corresponds to one light-transmissive portion 510 and one light source 300 below. However, in different embodiments, based on considerations such as increasing a light-exiting area and improving the light-exiting uniformity, the light source 300 may be used with a light guide element, and may not be disposed right below the baseplate hole 110 and the light-transmissive portion 510.

More specifically, in the embodiment shown in FIG. 12B, the backlight module 808 further includes a plurality of light guide sheets 320 (or an integrated one) respectively disposed at one side of one of the periphery light sources 300. Vertical projections of the each light guide sheet 320 and a corresponding light-transmissive portion 510 on the baseplate 100 overlap with a corresponding baseplate hole 110. In other words, each baseplate hole 110 respectively corresponds to one light-transmissive portion 510 and one light guide sheet 320 below. The light provided by the light source 300 is respectively emitted in from a side face 321 of an adjacent light guide sheet 320 and emitted out from a top face 322.

Figure 13A:
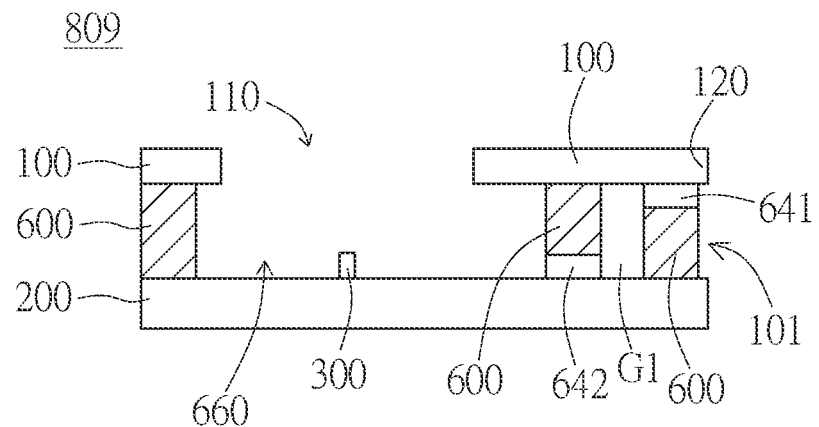
FIG. 13A and FIG. 13B are schematic diagrams of a twelfth embodiment of a backlight module according to the present invention.
Figure 13B:
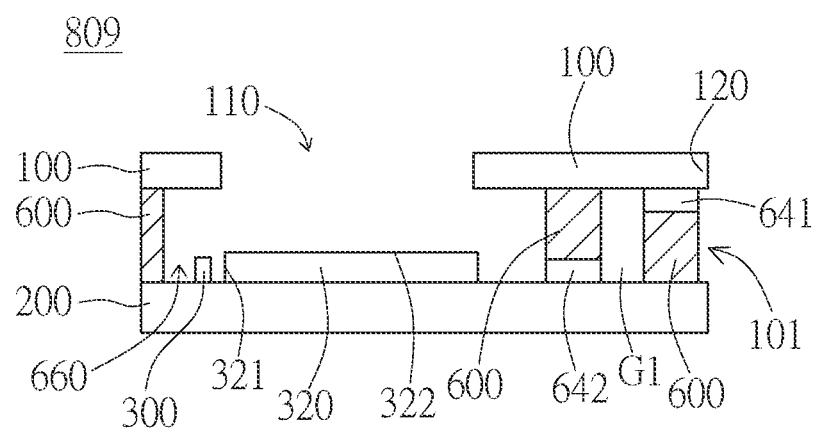

In different embodiments shown in FIG. 13A and FIG. 13B, a shielding structure includes a plurality of spacers 600, and the spacers 600 are staggered up and down between a baseplate 100 and a lower substrate 200 in a near-to-far direction relative to those periphery light sources 300 distributed on a periphery, and are located between those periphery light sources 300 distributed on the periphery and an outer edge 120 of the baseplate 100. Further, the spacers 600 are connected to the baseplate 100 and the lower substrate 200 respectively through a first adhesion layer 641 and a second adhesion layer 642. Because light travels in a straight line, and the first adhesion layer 641 and the second adhesion layer 642 are not on the same straight line relative to the periphery light sources 300, the shielding structure 400 can prevent light emitted by the periphery light sources 300 from being emitted out of an outer edge gap 101, that is, prevent the light from leaking at a side edge of a backlight module 809. The first adhesion layer 641 and the second adhesion layer 642 may be further made of a light-proof material, to reduce light to pass through. On the other hand, in addition that light may attenuate when traveling in a medium, the light may also attenuate due to refraction and partial reflection when entering different media. Therefore, the gaps G1 between the spacers 600 can promote the attenuation of the light. Namely, at least two said spacers 600 may be aligned in series toward the outer edge gap 101 while shifted from each other in a direction not aiming to the outer edge gap 101 (not disposed on the same straight line). Similarly, the at least two adhesion layers 641, 642 may be aligned in series toward the outer edge gap 101 while shifted from each other in a direction not aiming to the outer edge gap 101 (not disposed on the same straight line).

In an embodiment shown in FIG. 13A, the baseplate 100 is provided with a plurality of baseplate holes 110, and vertical projections of the periphery light sources 300 on the baseplate 100 overlap with the baseplate holes 110. In other words, each baseplate hole 110 respectively corresponds to one light source 300 below. However, in different embodiments, based on considerations such as increasing the light-exiting area and improving the light-exiting uniformity, the light source 300 may be used with a light guide element, and may not be disposed right below the baseplate hole 110.

More specifically, in the embodiment shown in FIG. 13B, the backlight module 809 further includes a plurality of light guide sheets 320 (or an integrated one) respectively disposed at one side of one of the periphery light sources 300. Vertical projections of the each light guide sheet 320 and a corresponding light-transmissive portion 510 on the baseplate 100 overlap with a corresponding baseplate hole 110. In other words, each baseplate hole 110 respectively corresponds to one light guide sheet 320 below. The light provided by the light source 300 is respectively emitted in from a side face 321 of an adjacent light guide sheet 320 and emitted out from a top face 322.

Figure 14A:
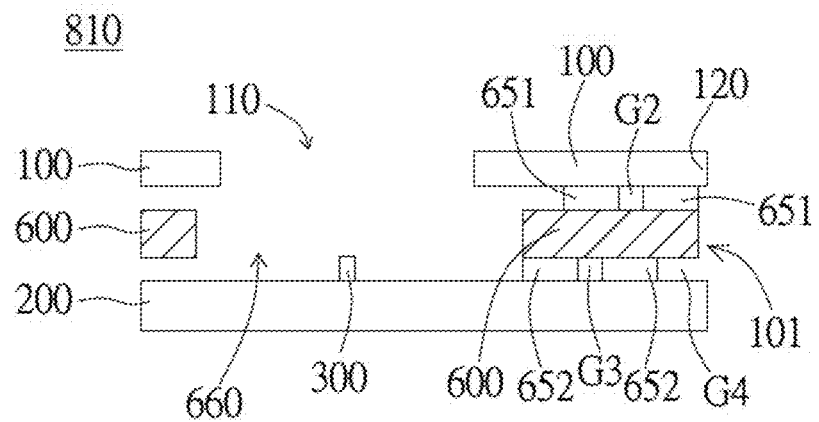
FIG. 14A and FIG. 14B are schematic diagrams of a thirteenth embodiment of a backlight module according to the present invention.
Figure 14B:
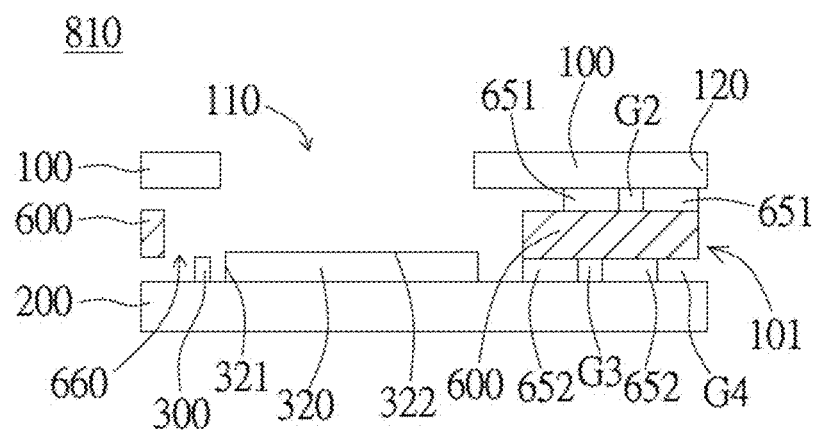

In different embodiments shown in FIG. 14A and FIG. 14B, a shielding structure includes a spacer 600, a plurality of first adhesion layers 651, and a plurality of second adhesion layers 652. The spacer 600 is disposed between a baseplate 100 and a lower substrate 200, and is located between those periphery light sources 300 distributed on a periphery and an outer edge 120 of the baseplate 100. The first adhesion layers 651 are disposed between the spacer 600 and the baseplate 100, and at least one gap G2 is located between the first adhesion layers 651. The second adhesion layers 652 are disposed between the spacer 600 and the lower substrate 200, and at least a gap G3 is located between the second adhesion layers 652. Another air gap G4 is defined between the outer adhesion layer (e.g. the second adhesion layer 652 that is located near the outer edge gap 101) and the outer edge gap 101. Further, in addition that light may attenuate when traveling in a medium, the light may also attenuate due to refraction and partial reflection when entering different media. Therefore, the air gaps G2, G3 between the first adhesion layers 651 and between the second adhesion layers 652 can promote the attenuation of the light. In this way, the shielding structure 400 can prevent the light emitted by the light source 300 from being emitted out of the outer edge gap 101, that is, prevent the light from leaking at a side edge of a backlight module 810. The first adhesion layer 651 and the second adhesion layer 652 may be further made of a light-proof material, to reduce light to pass through. Certainly, at least one of the spacer(s) 600 and the adhesion layers 641/642, 651/652 in FIG. 13A, 13B, 14A, or 14B may be opaque to work as the shielding structure 400 to block light toward the outer edge gap 101.

In an embodiment shown in FIG. 14A, the baseplate 100 is provided with a plurality of baseplate holes 110, and vertical projections of the periphery light sources 300 on the baseplate 100 overlap with the baseplate holes 110. In other words, each baseplate hole 110 respectively corresponds to one light source 300 below. However, in different embodiments, based on considerations such as increasing the light-exiting area and improving the light-exiting uniformity, the light source 300 may be used with a light guide element, and may not be disposed right below the baseplate hole 110.

More specifically, in the embodiment shown in FIG. 14B, the backlight module 810 further includes a plurality of light guide sheets 320 (or an integrated one) respectively disposed at one side of one of the periphery light sources 300. Vertical projections of the each light guide sheet 320 and a corresponding light-transmissive portion 510 on the baseplate 100 overlap with a corresponding baseplate hole 110. In other words, each baseplate hole 110 respectively corresponds to one light guide sheet 320 below. The light provided by the light source 300 is respectively emitted in from a side face 321 of an adjacent light guide sheet 320 and emitted out from a top face 322.

The present invention has been described in the foregoing related embodiments, but the foregoing embodiments are only examples for implementing the present invention. It should be pointed out that the disclosed embodiments do not limit the scope of the present invention. On the contrary, modifications and equivalent arrangements included in the spirit and scope of the claims are all included in the scope of the present invention.

What is claimed is:

1. A backlight module comprises:
    a spacer, having at least one spacer hole, an outer edge gap being defined outside an outer edge of the spacer;
    a lower substrate, disposed below the spacer;
    at least one light source, disposed on the lower substrate and located within the spacer hole; and
    a shielding structure, disposed outside said light source to at least partially block light provided by said light source from emitting towards the outer edge gap;
    wherein an inner adhesion layer and an outer adhesion layer are disposed on a flat surface of the spacer, and at least one air gap is located between the inner adhesion layer and the outer adhesion layer;
    wherein the inner adhesion layer, the at least one air gap and the outer adhesion layer are aligned in series toward the outer edge gap to jointly form the shielding structure to reduce partial light of the light source from leaking out of the outer edge gap.

2. The backlight module according to claim 1, wherein the inner adhesion layer and the outer adhesion layer are disposed between said light source and the outer edge gap.

3. The backlight module according to claim 1, wherein the outer edge gap is an air gap outside the outer adhesion layer.

4. The backlight module according to claim 1, wherein another air gap is defined between the light source and the inner adhesion layer.

5. The backlight module according to claim 1, wherein another air gap is defined between the outer adhesion layer and the outer edge gap.

6. The backlight module according to claim 1, wherein the inner adhesion layer, the air gap and the outer adhesion layer are located between the spacer and the lower substrate.

7. The backlight module according to claim 1, further comprising a light masking sheet disposed above the light source, wherein a portion of the light masking sheet extending out of the outer edge gap further extends downward to form a portion of the shielding structure to shield the outer edge gap.

8. The backlight module according to claim 7, wherein the inner adhesion layer, the air gap and the outer adhesion layer are located between the light masking sheet and the spacer.

9. A luminous keyboard, comprising:
    the backlight module according to claim 1;
    a key module, comprising a plurality of key units and a baseplate, wherein the plurality of key units are disposed on the baseplate.

10. A backlight module comprises:
    a lower substrate;
    at least one light source, disposed on the lower substrate;
    a light guide sheet, disposed above the lower substrate and adjacent to the light source for guiding light;
    an outer edge gap, defined outside the light guide sheet; and
    a shielding structure, disposed outside said light source to block light provided by said light source from emitting towards the outer edge gap;

wherein an inner adhesion layer and an outer adhesion layer are disposed on the lower substrate, and at least one air gap is located between the inner adhesion layer and the outer adhesion layer;

wherein the inner adhesion layer, the at least one air gap and the outer adhesion layer are aligned in series toward the outer edge gap to jointly form the shielding structure to reduce partial light of the light source from leaking out of the outer edge gap.

11. The backlight module according to claim 10, wherein the inner adhesion layer and the outer adhesion layer are disposed between said light source and the outer edge gap.

12. The backlight module according to claim 10, wherein the outer edge gap is an air gap outside the outer adhesion layer.

13. The backlight module according to claim 10, wherein another air gap is defined between the light source and the inner adhesion layer.

14. The backlight module according to claim 10, wherein another air gap is defined between the outer adhesion layer and the outer edge gap.

15. The backlight module according to claim 10, further comprising a light masking sheet disposed above the light source, wherein a portion of the light masking sheet extending out of the outer edge gap further extends downward to form a portion of the shielding structure to shield the outer edge gap.

16. The backlight module according to claim 15, wherein the inner adhesion layer, the air gap and the outer adhesion layer are located between the light masking sheet and the lower substrate.

\* \* \* \* \*